US006783596B2

(12) United States Patent
Schaefer et al.

(10) Patent No.: US 6,783,596 B2
(45) Date of Patent: Aug. 31, 2004

(54) WAFER HANDLING DEVICE

(75) Inventors: Andre Schaefer, München (DE); Andrea Zuckerstaetter, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/224,619

(22) Filed: Aug. 20, 2002

(65) Prior Publication Data
US 2003/0033981 A1 Feb. 20, 2003

(30) Foreign Application Priority Data

Aug. 20, 2001 (DE) .......................... 101 40 761

(51) Int. Cl.⁷ .................. B05C 13/00; B05C 13/02; C23C 16/00; B65G 49/07
(52) U.S. Cl. .............. 118/503; 118/500; 118/728; 156/345.23; 156/345.51; 204/298.15; 414/941
(58) Field of Search ............ 118/503, 728–732, 118/500; 156/345.5–345.55, 345.23, 345.22; 204/298.15; 414/941

(56) References Cited

U.S. PATENT DOCUMENTS

| 4,062,318 A | * | 12/1977 | Ban et al. .................... 118/725 |
| 4,354,453 A | * | 10/1982 | Koike et al. ................. 118/426 |
| 4,651,674 A | * | 3/1987 | Hayashi et al. .............. 118/728 |
| 4,877,573 A | * | 10/1989 | Nilsson ....................... 117/108 |
| 4,932,358 A | * | 6/1990 | Studley et al. .............. 118/728 |
| 5,001,327 A | * | 3/1991 | Hirasawa et al. ........... 219/390 |
| 5,242,501 A | * | 9/1993 | McDiarmid .................. 118/728 |
| 5,810,931 A | | 9/1998 | Stevens et al. |
| 6,012,509 A | * | 1/2000 | Nonaka ...................... 165/80.2 |
| 6,251,191 B1 | * | 6/2001 | Matsuse ...................... 118/719 |

FOREIGN PATENT DOCUMENTS

| DE | 9213054 U1 | 3/1994 | |
| DE | 69021952 T2 | 5/1996 | |
| EP | 325663 A1 * | 8/1989 | .......... C23C/16/44 |
| JP | 62023983 A * | 1/1987 | .......... C23C/16/50 |

OTHER PUBLICATIONS

Armin G. Aberle, "Overview on SiN Surface Passivation of Crystalline Silicon Solar Cells" 2001in Solar Energy Materials Solar Cells vol. 165 (2001), pp. 239–248.

* cited by examiner

*Primary Examiner*—Parvis Hassanzadeh
*Assistant Examiner*—Karla Moore
(74) *Attorney, Agent, or Firm*—F. Chau & Associates, LLC

(57) ABSTRACT

The present invention provides a wafer handling device having a base plate (G; G'), which has a first and a second supporting surface for a respective wafer (W1, W2) to be laid on; and a fixing device (K1, K2, S; K1', K2', S') for the detachable fixing of the respective wafer (W1, W2) on the first and second supporting surface; the fixing device (K1, K2, S; K1', K2', S') being configured in such a way that it contacts the respective wafer (W1, W2) only in the outer edge region of the side facing away from the supporting surface.

4 Claims, 3 Drawing Sheets

WAFER HANDLING DEVICE

This application claims priority to German Patent Application No. 101 40 761.0, filed on Aug. 20, 2001, which is incorporated herein by reference.

The present invention relates to a wafer handling device.

From wafer fabrication technology it is known for wafers to be processed in so-called chamber processes or bath processes to be combined into groups and, by means of suitable wafer carriers, moved into an appropriate process chamber or an appropriate bath.

The known wafer carriers are containers with a number of insertion slots, into which the wafers are inserted individually. Usually, in particular when thin wafers are used, they need a relatively large amount of space for each wafer, to be specific typically one space of ten times the wafer thickness for each wafer.

It is therefore an object of the present invention to specify a wafer handling device which permits an increase in the wafer throughput in wafer fabrication.

According to the invention, this object is achieved by the wafer handling device specified in claim 1.

The idea on which the present invention is based is to increase the wafer throughput by two wafers being joined back to back and, joined in this way, put into an appropriate process. For this purpose, the two wafers are held by a special fixing device on a base plate located between them. In this way, by means of the fixing device, a temporary connection between two wafers back to back can be set up for individual process steps.

The wafer handling device according to the invention has, inter alia, the advantage that the wafer throughput can be virtually doubled.

Advantageous refinements and improvements of the wafer handling device specified in claim 1 will be found in the subclaims.

According to one preferred development, the fixing device has two ring-like flaps.

According to a further preferred development, the two ring-like flaps are held on the base plate at a common hinge.

According to a further preferred development, the base plate has a recess on each side to hold the respective wafer.

According to a further preferred development, the base plate is configured in such a way that the back of the wafer is sealed off hermetically when the wafer is fixed. This development of the wafer handling device is in particular of great benefit for cases in which the back of the wafer is intended not to come into contact with a process medium. In this case, it was previously necessary to provide the back of the wafer with a protective layer, for example with a varnish layer. This is rendered superfluous when the wafer handling device according to the invention is used, if said device is dimensioned in such a way that the back of the wafer is sealed off hermetically.

According to a further preferred development, the wafer handling device according to the invention is used in a chamber process, in particular an oven process, plasma process, deposition process or bath process or the like.

Exemplary embodiments of the invention are illustrated in the drawings and explained in more detail in the following description.

In the drawings.

In the figures, the same reference symbols designate identical or functionally identical constituent parts.

Figure 1:
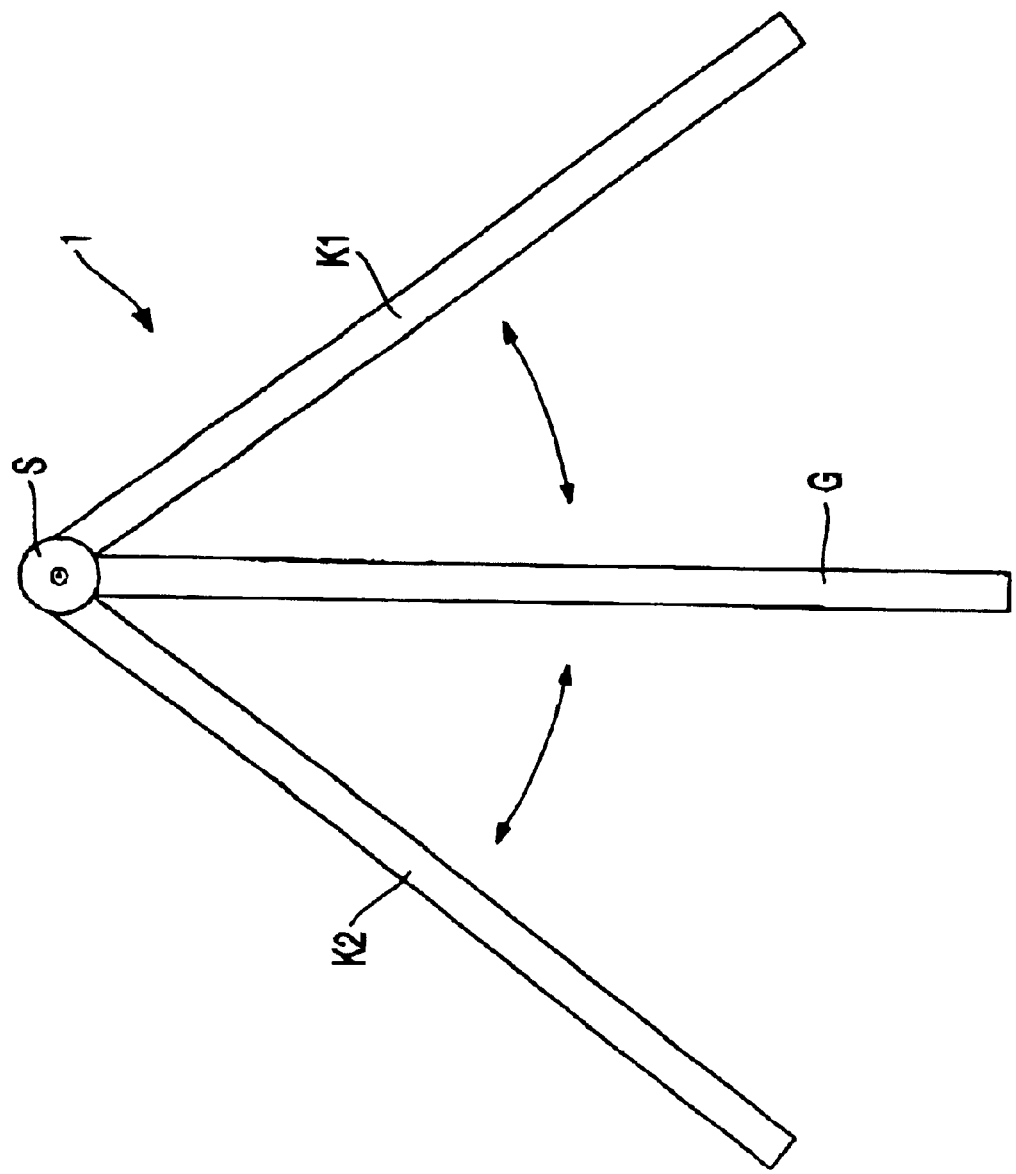
FIG. 1 shows a schematic illustration of a wafer handling device as a first embodiment of the present invention.

In FIG. 1, reference symbol 1 designates a wafer handling device in general. The wafer handling device 1 according to this first embodiment has a base plate G which has a round shape with a diameter which is somewhat larger than the wafer diameter. Provided on the outer side of the base plate G is a hinge S, to which, in addition to the base plate G, a first and second ring-like clamp K1 and K2 are attached. By means of the hinge S, the clamps K1, K2 can be pressed flush against the base plate G in the direction of the arrow according to FIG. 1, and can be locked there with a specific contact pressure. This makes it possible to hold a wafer clamped between each supporting surface of the base plate G and the respective clamp K1, K2. In this case, the back of the wafer rests completely on the base plate G.

Figure 2:
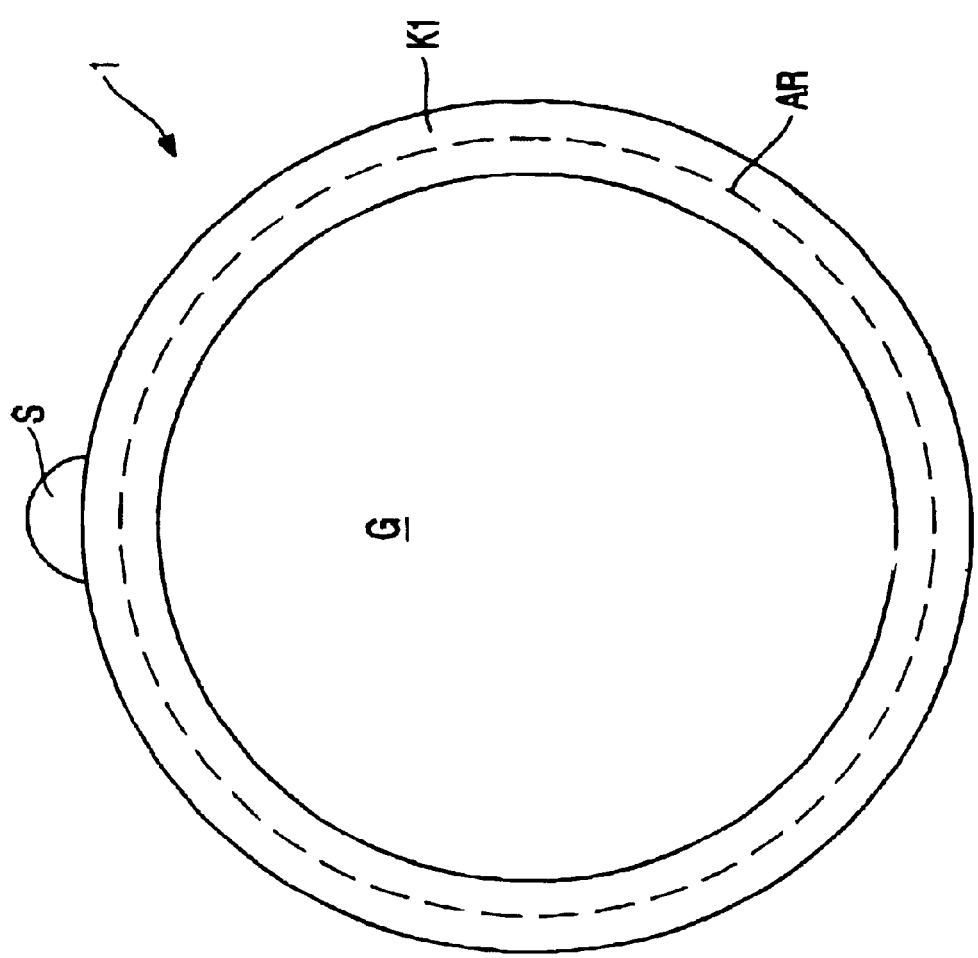
FIG. 2 shows a side view of the wafer handling device of FIG. 1.

FIG. 2 is a side view of the wafer handling device of FIG. 1.

As can be seen from FIG. 2, the clamps K1, K2 are shaped like a circular ring and clamp the respective wafer only at the outer periphery of its front side, so that virtually the entire front side of the wafer is exposed for the relevant process step. The dashed line in FIG. 2 in this connection designates the outer edge AR of the wafer to be clamped in by means of the wafer handling device 1.

Figure 3:
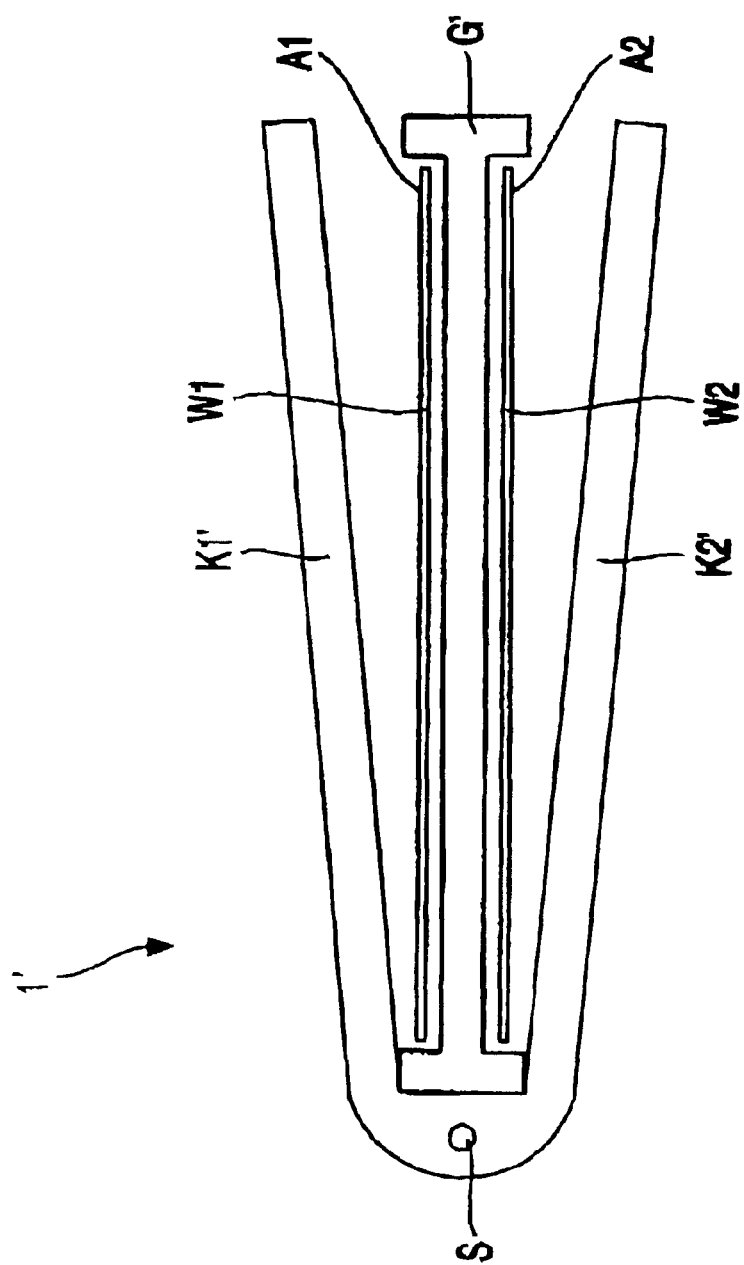
FIG. 3 shows a schematic illustration of a wafer handling device as a second embodiment of the present invention.

FIG. 3 shows a schematic illustration of a wafer handling device as a second embodiment of the present invention.

In the second embodiment according to FIG. 3, the base plate G' has a specific shape, namely a shape in which a recess A1 and A2 is provided on each side of the base plate G', the diameter of said recess being slightly greater than the wafer diameter. A corresponding wafer W1 and W2 can be laid in this respective recess A1 and A2, the recess ensuring that the wafer rests on the base plate G' in a centered manner.

In a way analogous to the first embodiment, the second embodiment has two clamps K1', K2', by means of which the wafer W1 or W2 is to be fixed on the base plate G'.

As distinct from the first embodiment, the respective clamp K1' or K2', however, does not rest directly on the wafer but on the circumferential edge of the base plate G'. This has the advantage that no forces are transmitted directly to the respective wafer W1 or W2.

With appropriate dimensioning of the wafer handling device 1 or 1' of the first or second embodiment, after it has been packed with two wafers, it can be inserted into a conventional wafer carrier or into a slightly modified wafer carrier and, using such a packed wafer carrier, chamber processes or bath processes can be loaded.

Although the present invention has been described above using preferred exemplary embodiments, it is not restricted to these but can be modified in many ways.

In particular, the fixing device can assume other conventional clamp forms.

List of reference symbols:

K1, K2, K1', K2' Clamp
G, G' Base plate
W1, W2 Wafer
S, S' Hinge
1, 1' Wafer handling device
AR Outer edge of the wafer
A1, A2 Recess

What is claimed is:

1. A wafer handling device comprising:

a base plate comprising a first and second supporting surface for respectively supporting a first and a second wafer laid thereon; and a fixing device comprising two ring-like flaps for detachably fixing the first and second wafer on the first and second supporting surface, respectively, wherein the fixing device is configured to contact the first and second wafer on an outer edge region of the surface of the wafers facing away from the supporting surface, and wherein the two ring-like flaps are held on the base plate at a common hinge.

2. A wafer handling device according to claim 1, wherein the base plate comprises a recess on each side of the base plate to hold a wafer.

3. A wafer handling device according to claim 1, wherein the base plate is configured to hermetically seal off the back of a wafer that is fixed on the base plate.

4. A wafer handling device according to claim 1, wherein the wafer handling device is used in a chamber process comprising one of an oven process, plasma process, deposition process, bath process and the like.

* * * * *